United States Patent
Kim et al.

[11] Patent Number: 6,004,882
[45] Date of Patent: Dec. 21, 1999

[54] METHOD FOR ETCHING PT FILM OF SEMICONDUCTOR DEVICE

[75] Inventors: Hyoun-woo Kim, Seoul; Byeong-yun Nam, Suwon; Byong-sun Ju, Seoul; Won-jong Yoo, Seoul, all of Rep. of Korea

[73] Assignee: Samsung Electronics, Co., Ltd., Suwon, Rep. of Korea

[21] Appl. No.: 09/016,022

[22] Filed: Jan. 30, 1998

[30] Foreign Application Priority Data

Feb. 5, 1997 [KR] Rep. of Korea .................. 97-3580
Jun. 9, 1997 [KR] Rep. of Korea .................. 97-23660

[51] Int. Cl.$^6$ .................................................. H01L 21/302
[52] U.S. Cl. ........................................ 438/706; 438/717
[58] Field of Search .................................. 438/710, 712, 438/714, 722, 736, 720, 742, 650, 643, 653

[56] References Cited

U.S. PATENT DOCUMENTS

| | | | |
|---|---|---|---|
| 3,951,709 | 4/1976 | Jacob | 216/67 |
| 3,975,252 | 8/1976 | Fraser, et al. | |
| 5,318,665 | 6/1994 | Oikawa | 438/720 |
| 5,413,669 | 5/1995 | Fujita | 438/643 |
| 5,492,855 | 2/1996 | Matsumoto et al. | 216/6 |
| 5,515,984 | 5/1996 | Yokoyama et al. | 216/41 |
| 5,605,601 | 2/1997 | Kawasaki | 438/643 |
| 5,612,606 | 4/1997 | Hwang . | |
| 5,688,718 | 11/1997 | Shue | 438/653 |

FOREIGN PATENT DOCUMENTS 0 675 548 A2 10/1995 European Pat. Off. .
0 786 805 A2 7/1997 European Pat. Off. .

OTHER PUBLICATIONS

Yokoyama, et al., "High–Temperature Etching in PZT/PT/TIN Structure by High–Density ECR Plasma"; *Japanese Journal of Applied Physics*; vol. 34, No. 2B, Part 01; Feb. 1, 1995; pp. 767–770.

*Primary Examiner*—Robert Kunemund
*Assistant Examiner*—Bernadine Okoro
*Attorney, Agent, or Firm*—Marger Johnson & McCollom, P.C.

[57] ABSTRACT

A method for etching a platinum (Pt) layer of a semiconductor device is provided which improves the etching slope of a sidewall of the platinum layer used as a storage node of the semiconductor device. The semiconductor device consists of a semiconductor substrate including a bottom layer on which various other layers are formed. Specifically, according to this invention, a Pt layer is formed on a bottom layer of a semiconductor substrate. An adhesive layer is then formed on the Pt layer while a mask layer is formed on the adhesive layer. After formation of the various layers, the mask layer and adhesive layer are patterned using an etching process to form a mask pattern and an adhesive layer mask pattern, respectively. The semiconductor substrate is then heated and an etching process is performned on the Pt layer using the mask pattern and the adhesive layer mask pattern to form etching slope sidewalls of the Pt layer having etching slopes close to vertical. Accordingly, the Pt electrodes of the semiconductor device of the present invention have a finer pattern than those of the prior art. Finally, overetching is done to remove the mask pattern.

10 Claims, 2 Drawing Sheets

METHOD FOR ETCHING PT FILM OF SEMICONDUCTOR DEVICE

This application corresponds to Korean patent application No. 97-3580 filed Feb. 5, 1997 in the name of Samsung Electronics Co., Ltd., which is herein incorporated by reference for all purposes.

BACKGROUND OF THE INVENTION

1. Field of the Invention

The present invention relates to a method of fabricating a semiconductor memory device, and more particularly, to a method for etching a Pt film or layer which is used as a storage node of a capacitor of a semiconductor memory device.

2. Description of the Related Art

In general, as semiconductor memory devices (such as a dynamic random access memory (DRAM)) become more highly integrated, they require capacitors of high capacitance which occupy only a small area. To satisfy this integration requirement, a trench type or cylinder type capacitor has been developed which offers high capacitance with a relatively small surface area. Unfortunately, however, the trench type or cylinder type capacitor is difficult to form correctly and requires a complicated fabrication process. Therefore, using conventional technology, there are severe, practical limits to the realization of the desired high capacitance and high integration of the semiconductor memory device.

To solve the problems of fabrication difficulty and inconsistency, a method for forming a capacitor has been developed and widely utilized which uses barium strontium titanate (BST) as a dielectric of the capacitor. BST has a dielectric constant approximately 400 times higher than that of a conventional dielectric. When the capacitor is formed using a material having a high dielectric constant, such as BST, a platinum (Pt) layer is usually used as plate and storage nodes of the capacitor. Pt is used because it is a stable material and therefore does not oxidize at the surface of the dielectric during the high-temperature heat treatment required for forming the BST dielectric film. Moreover, Pt has excellent conductivity and therefore less leakage current is generated from the dielectric electrode of the capacitor than when other conductive films such as iridium (Ir), ruthenium (Ru), or polysilicon are used. One drawback of Pt, however, is that because it is a non-reactive metal, it does not react easily with other chemicals and is therefore very difficult to pattern using dry etching.

Due to this difficulty, halogen is usually used for etching the Pt layer in a process known as "reactive ion etching" (RIE). Unfortunately, because halogen reacts only weakly with Pt ions, the Pt layer is etched primarily by a physical reaction called "ion sputtering" rather than by a chemical reaction. As the Pt layer is etched by ion spluttcrinig, etchingy residues are generated which reduce the etching slope of the Pt layer and thereby result in Pt electrodes which do not have a fine pattern. A fine pattern of Pt electrodes is desirable because the BST capacitor will be used increasingly in fine pattern DRAM devices. Also, because of the difficulty in etching the Pt layer, the etch rate is generally low. A low etch rate is undesirable because it results in low throughput. In order to improve the low etch rate during reactive ion etching, an etching gas containing chlorine or fluorine is used because of the possibility of Pt compound formation.

A conventional method for etching the Pt layer, using chlorine gas as an etching gas, is disclosed in U.S. Pat. No. 5,515,984 "Method for etching Pt layer," issue date May, 14, 1996. According to this conventional method, chlorine and oxygen are used as an etching gas. Etching residues platinum chloride (PtCl) and platinum monoxide (PtO) arc correspondingly formed on the sidewalls of an etching resist film and the Pt layer is etched using the etching resist film and the etching residues as an etching mask. The etching residues are then removed by a process known as "wet etching." Despite the improvements offered by this technique over the other processes described above, the etching residues left by this process require appropriate removal, and the etching slope of the Pt layer is still less than desirable. As for the etching residue, it was revealed from experiments that most of the residue is pure aluminum rather than platinum compounds, so most of the residues cannot be removed by wet etching. The industry is therefore in need of a method for etching a Pt layer of a semiconductor device which results both in an improved etching slope of the Pt layer and in Pt electrodes having a finer pattern.

SUMMARY OF THE INVENTION

To solve the problems experienced in the prior art, it is an object of the present invention to provide a method for etching a Pt layer of a semiconductor device which results in an improved etching slope of a sidewall of the Pt layer.

According to this invention, a method for etching a Pt layer of a semiconductor device is provided in which a semiconductor substrate, where a Pt layer is formed, is heated to a predetermined temperature during an etching process of the Pt layer. An adhesive layer containing titanium (Ti) is used as an etching mask on the Pt layer in order to improve the etching slope of the Pt layer and to improve the electrode pattern.

Specifically, the method for etching a Pt layer of a semiconductor device includes forming a barrier layer, a Pt layer, an adhesive layer containing Ti, and a mask layer on the semiconductor substrate, in sequence. The semiconductor substrate includes a bottom layer in which the trench or cylinder type capacitors arc formed. The mask layer is then patterned to form a mask pattern, following which the adhesive layer is patterned using the mask pattern. Patterning is performed by dry etching, using a mixture of argon and chlorine as an etching gas.

The resultant structure is heated to a temperature of approximately between 120~300° C., in a plasma etching apparatus, without exciting the plasma of the etching apparatus. The Pt layer is then etched using a patterned mask layer and a patterned adhesive layer formed on the semiconductor substrate. The mask layer is preferably composed of one or more layers including at least one oxide layer. It is also preferable for the adhesive layer to contain Ti and to have the barrier layer formed of titanium nitride (TiN) or a material containing TiN. The bottom layer of the semiconductor substrate includes a first insulating layer having contact holes formed on the semiconductor substrate, each of which is filled with a polysilicon plug.

The Pt layer is patterned using mixtures of oxygen and chlorine ($O_2/Cl_2$), oxygen and hydrogen bromide ($O_2$/HBr), oxygen and bromine ($O_2/Br_2$), or oxygen and argon ($O_2$/Ar) as etching gases. Preferably, the Pt layer is patterned using an etching method known as "magnetically enhanced reactive ion etching" (MERIE), and using $O_2/Cl_2$ as the etching gas, where oxygen is 50% or more of the total $O_2/Cl_2$ mixture by flow rate (sccm). The mask pattern on the Pt layer is then removed by overetching.

Overetching to remove the mask pattern is performed by extending the total etching time by about an additional 0.5~1.5 times the etching time required to etch up to an etching end point of the Pt layer. The adhesive layer and the barrier layer are patterned using a mixture of argon and chlorine (Ar/Cl$_2$) as the etching gas.

In summary, according to the present invention, the semiconductor substrate where the platinum (Pt) layer is formed is heated to a predetermined temperature and the platinum (Pt) layer is overetched using an etching gas. An adhesive layer containing titanium (Ti) is used as an etching mask on the platinum (Pt) layer. The Ti etching mask increases protection of the Pt layer from erosion during the etching process and the etching slope of the sidewall of the platinum (Pt) layer is thereby improved.

BRIEF DESCRIPTION OF THE DRAWINGS

The objects and advantages of the present invention will become more readily apparent from the following detailed description of a preferred embodiment made with reference to the attached drawings in which:

FIGS. 1 through 5 are sectional views of a semiconductor device illustrating a method for etching a Pt layer of a semiconductor device according to the present invention.

FIG. 1 is a sectional view of a semiconductor device following the formation of a bottom layer including trench or cylinder type capacitors and a Pt layer according to the present invention.

FIG. 2 is a sectional view of the semiconductor device of FIG. 1 following the formation of an adhesive layer on the Pt layer and a mask layer on the adhesive layer according to the present invention.

FIG. 3 is a sectional view of the semiconductor device of FIG. 2 following an etching process of the Pt layer according to the present invention.

FIG. 5 is a sectional view of the semiconductor device of FIG. 4A after the mask pattern is overetched, the adhesive layer mask pattern is removed from the Pt layer, and a barrier layer is patterned under the Pt layer.

DETAILED DESCRIPTION

Figure 1:
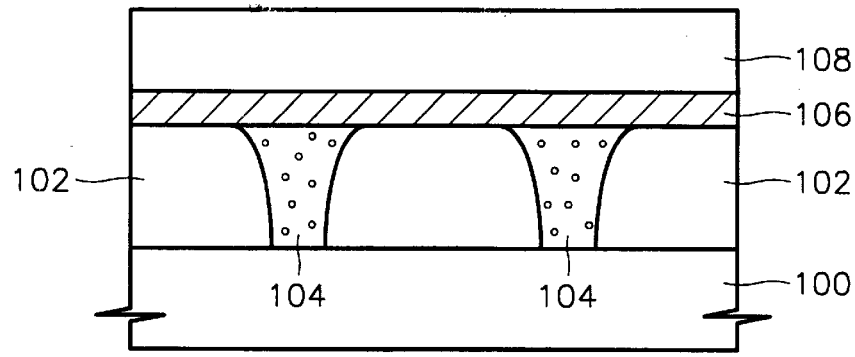

FIG. 1 is a sectional view of a semiconductor device following the formation of a bottom layer 102, plug 104, a barrier layer 106, and a Pt layer 108 according to the present invention. Referring to FIG. 1, a bottom layer 102 is formed on a semiconductor substrate 100 where a lower structure such as a transistor (not shown) is formed. The bottom layer 102 is created by forming a first insulating layer (i.e., an interlayer dielectric) on the semiconductor substrate 100, patterning the first insulating layer to form a contact hole, and filling the contact hole with a polysilicon plug 104. The semiconductor substrate is subsequently planarized through a planarization process such as etchback or chemical mechanical polishing performed on the bottom layer 102.

A barrier layer 106 is then formed over the entire surface of the substrate where the planarization process has been performmned in order to prevent deterioration of capacitor performance due to inter-diffusion of the polysilicon plug 104 and a Pt layer 108, formed on the barrier layer 106. The barrier layer 106 is formed to a thickness of approximately 300~700 Å using titanium nitride (TiN) or a material containing TiN. Pt is deposited on the barrier layer 106 in a conventional manner, such as sputtering or chemical vapor deposition (CVD), to form the Pt layer 108. In a preferred embodiment of the present invention, the Pt layer 108 is a conductive layer used as a storage node of a capacitor in a semiconductor memory device and is formed to a thickness of approximately 2000 Å±500 Å.

Figure 2:
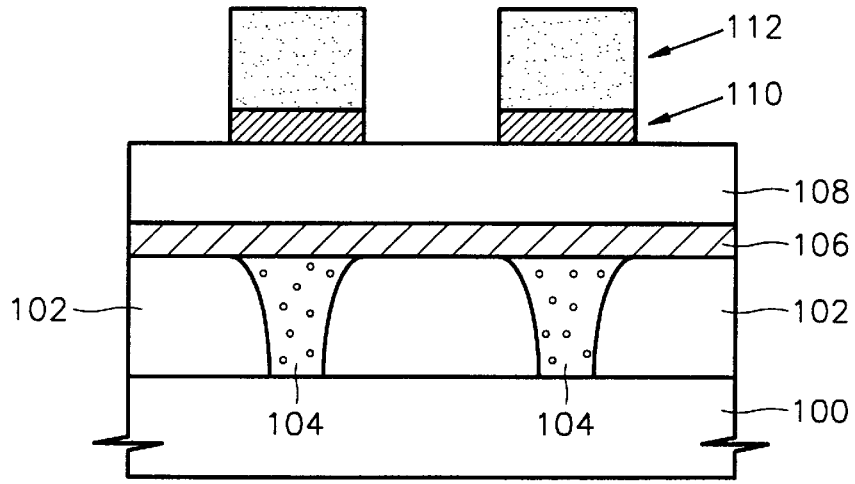

FIG. 2 is a sectional view of the semiconductor device of FIG. 1 following the formation of an adhesive layer on the Pt layer and a mask layer on the adhesive layer according to the present invention. Referring to FIG. 2, an adhesive layer 110, for enhancing the adhesion of a mask layer to the Pt layer 108, is formed by depositing titanium (Ti) on the same structure where the Pt layer 108 is formed. The adhesive layer 110 in the present embodiment is formed to a thickness of approximately 400~800 Å. Subsequently, the mask layer 112 is formed on the adhesive layer 110 to a thickness of approximately 3000~6000 Å, and at least includes an oxide layer. The mask layer according to the present invention is not necessarily formed of a single layer, however. For example, although the mask layer may consist of only a single oxide layer, as in this embodiment, the mask layer may also be formed of a plurality of layers, at least one of which is an oxide layer. In other words, the mask layer may be a composite layer containing one or more oxide layers.

Following formation of the mask layer, the mask layer is coated with photoresist, and a conventional photolithographic process is performed on the mask layer to form a mask pattern 112. The adhesive layer 110 is then patterned using the mask pattern 112 as an etching mask in order to form an adhesive layer mask pattern 110 contacting the mask pattern 112. At this time, the adhesive layer is patterned using a dry etching process such as magnetically enhanced RIE (MERIE), for example, using a mixture of argon and chlorine Ar/Cl$_2$ as an etching gas.

Figure 3:
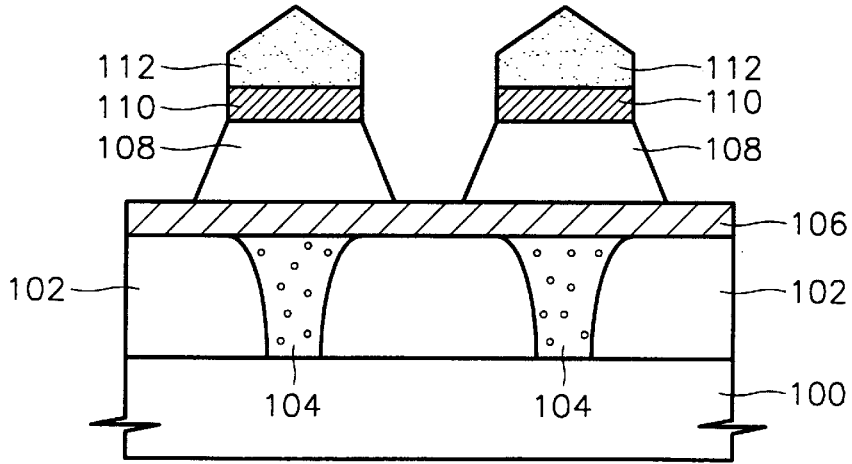

FIG. 3 is a sectional view of the semiconductor device of FIG. 2 following an etching process of the Pt layer according to the present invention. Referring to FIG. 3, following the formation of the mask pattern 112 and the adhesive layer mask pattern 110, the semiconductor substrate is heated to a temperature of approximately 120~300° C., without exciting a plasma of the MERIE equipment. The Pt layer 108 is then etched using an etching gas containing O$_2$ (i.e., O$_2$/Cl$_2$, O$_2$/HBr, O$_2$/Br$_2$ or O$_2$/Br) until a portion of the barrier layer 106 is exposed. The mask pattern 112 and the adhesive layer mask pattern 110 are used during this process as an etching mask. It is preferable that the O$_2$ content of the etching gas is at least 50% by flow rate (sccm) for the etching process. In the most preferred embodiment, the etching gas consists of a mixture of oxygen and chlorine in the ratio of 4:1 by flow rate (sccm). Accordingly, ions and radicals of the O$_2$ gas are species for the sputtering of the Pt layer. Furthermore, the O$_2$ gas increases an etching selection ratio of the Pt layer 108 with respect to the mask pattern 112 (formed of an oxide layer), and changes the Ti layer of the adhesive layer mask pattern 110 into TiO$_x$. TiO$_x$ acts as an additional etching mask pattern during the etching of the Pt layer. That is, a portion of O$_2$ ions and radicals partially oxidize the Ti layer into a TiO$_x$ layer, thereby reducing an erosion velocity of the mask.

Figure 4A:
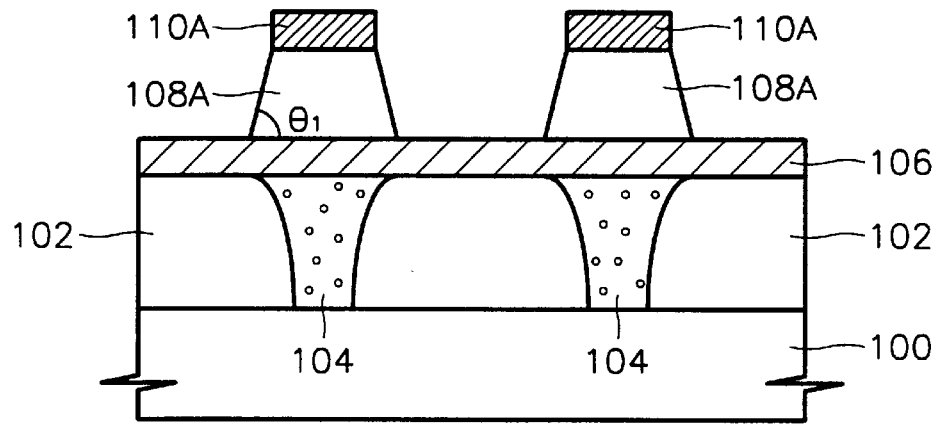
FIG. 4A is a sectional view of the semiconductor device of FIG. 3 following an overetching process performed at a high temperature to remove the mask layer according to the present invention.

FIG. 4A is a sectional view of a Pt layer 108A having an enhanced etching slope resulting from overetching of the Pt layer 108 (see FIG. 3) under the same etching conditions as those discussed with reference to FIG. 3. The mask pattern 112 (see FIG. 3) is eroded away completely and thereby removed during the overetching process. The overetching process is preferably performed by extending the total etching time by approximately 0.5~1.5 times the etching time required to expose the barrier layer 106 (i.e., an etching end point as shown in FIG. 3). When an etching gas containing oxygen, chlorine and Argon ($O_2/Cl_2/Ar$) is used, the etching slope of the Pt layer 108A, having a pitch of 0.58 μm and a thickness of 2000 Å, is 65° or less. This is because the Pt does not react with oxygen and chlorine. However, when the Pt layer 108A is etched using an etching gas containing significant amounts of oxygen, the Ti of the adhesive layer mask pattern 110A formed on the Pt layer is converted into $TiO_x$ and acts as an additional mask pattern (i.e., in addition to the mask pattern 112 containing the oxide layer).

The $TiO_x$ adhesive layer mask pattern 110A is eroded at a high temperature of approximately 120~300° C. at a rate equivalent to that at which it is eroded at room temperature. Accordingly, because the high temperature hastens the oxidation of Ti, and thus the formation of a $TiO_x$ layer, and because the erosion rate of the $TiO_x$ layer is relatively slow, erosion by oxygen ions or sputtering of a radical is relatively reduced according to this invention. Damage of the adhesive layer mask pattern 110A is therefore prevented at high process temperatures. Because the adhesive layer mask pattern 110A has relatively little erosion, the adhesive layer mask pattern 110A therefore acts as a factor for improving the etching slope of the Pt layer 108A. An etching slope of the Pt layer as close to vertical as possible is desired.

Figure 4B:
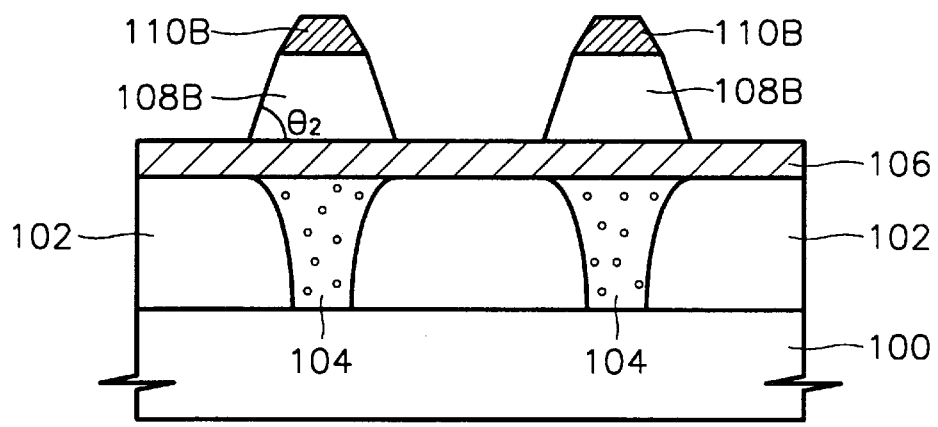
FIG. 4B is a sectional view for comparison of the semiconductor device of FIG. 3 following an overetching process performed at a low temperature to remove the mask layer.

FIG. 4B is a sectional view of a semiconductor substrate after etching at less than 120° C. to provide a comparison with the results of overetching at a high temperature as shown in FIG. 4A. Referring to FIG. 4B, when etching is performed at a temperature below 120° C., the mask pattern 112 is eroded and removed, and the edges of the adhesive layer mask pattern 110B are also eroded, causing the sidewall slope thereof to be degraded to an angle of approximately 45°. Accordingly, when the Pt layer is etched through sputtering at a low temperature, the adhesive layer mask pattern 110B cannot improve the etching slope. For example, when the overetching is performed with the chamber at a temperature of 130° C. and the semiconductor substrate surface at a temperature of 120° C., the etching slope $O_2$ of the Pt layer 108B is 72° or less.

In summary, referring to both FIGS. 4A and 4B, when overetching is performed at a temperature below 120° C., the adhesive layer mask pattern 110B containing Ti is rapidly eroded at its edges by ion sputtering. However, when the overetching is performed at a temperature of 120° C. or more (preferably above 160° C.), the adhesive layer mask pattern 110A is not eroded, even after the mask pattern 112 (see FIG. 3) is removed, and thus the etching slope of the sidewall of the Pt layer 108A is close to vertical (90°). This is because the Ti of the adhesive layer pattern 110A is converted to $TiO_x$ more rapidly than that of the adhesive layer mask pattern 110A etched at below 120° C. Specifically, when the temperature of the MERIE chamber is set at 160° C. and the surface temperature of the semiconductor substrate is set at 140° C., the etching slope θ1 of the Pt layer 108A is improved to an angle of approximately 80°. The temperatures described above of approximately 120~300° C. refer to the temperature of a semiconductor substrate surface. Accordingly, the overetching of the Pt layer 108A and the controlled etching temperature may improve the etching slope of the Pt layer.

Figure 5:
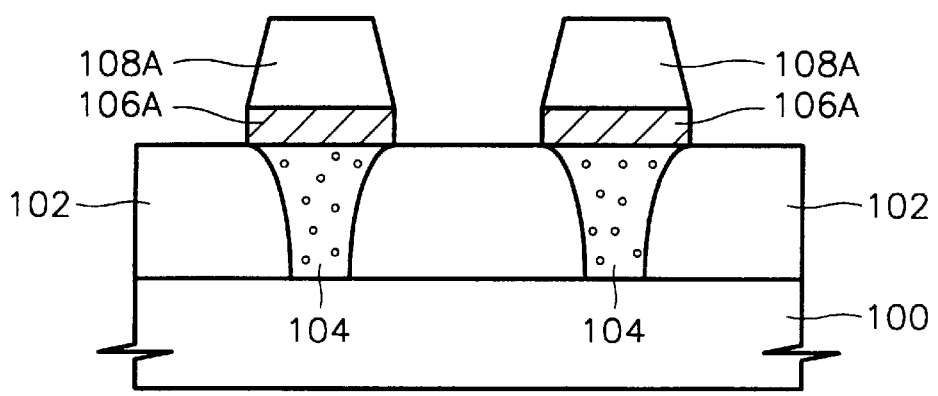

FIG. 5 is a sectional view of the semiconductor device after the mask pattern 112 is overetched, the adhesive layer mask pattern 110A (see FIG. 4A) is removed from the Pt layer 108A, and a barrier layer 106A is patterned. Referring to FIG. 5, A mixture of argon and chlorine ($Ar/Cl_2$) is used as the etching gas for removing the adhesive layer mask pattern 110A and for patterning the barrier layer 106A. Therefore, the etching of the Pt layer 108A, including the barrier layer 106A on a polysilicon plug 104, is completed by this process.

The following examples explain the relationship between an etching chamber temperature and the etching slope of a Pt layer. To obtain the following information, Pt layers were overetched at etching chamber temperatures of 100° C., 130° C. and 160° C., and the etching slope of the sidewall of each Pt layer was measured. The Pt layer in each case was 2000 Å thick, the adhesive layer on the Pt layer was 600 Å thick, and the mask pattern formed of an oxide layer was 5000 Å thick. When the temperature of the etching chamber was 100° C., 130° C. and 160° C. during the etching and overetching processes, the resulting etching slopes of the Pt layer sidewalls were 71°, 72° and 80°, respectively. As evidenced by this data, when the temperature of the etching chamber was increased from 100° C. to 130° C., the characteristics of the etching slope were not significantly enhanced. However, when the temperature of the etching chamber was increased to 160° C., the etching slope of the Pt layer was remarkably enhanced.

These results are explainable on the following grounds. When overetching was performed at an etching chamber temperature of 100° C., the mask pattern formed of an oxide layer was eroded and removed, and the edges of the adhesive layer which were converted to Ti or $TiO_x$ under the mask pattern were then continuously eroded. As a result, the adhesive layer was 600 Å thick at the center, but was eroded completely at the edges causing the etching slope of the adhesive layer sidewall to be 45°. When overetching was performed at an etching chamber temperature of 130° C., the thickness of the adhesive layer on the Pt layer was 600 Å at the center, but was eroded significantly at the edges. Accordingly, the adhesive layer was still eroded too much to enhance the etching slope significantly.

However, when the etching chamber temperature was set at 160° C. and the surface of the semiconductor substrate was at 140° C., even though the uppermost mask pattern is eroded, the adhesive layer thereunder is not eroded. In this case, therefore, the adhesive layers are 600 Å thick at both the edge and the center, and the etching slopes of the sidewalls are close to vertical (90°). Accordingly, it is possible to prevent the reduction of the etching slope of the Pt layer due to Pt atoms through sputtering while the Pt layer is anisotropically etched.

The respective etch rates, when the etching was performed under the above-described conditions, were 395 Å/min at 100° C., 368 Å/min at 130° C. and 371 Å/min at 160° C. Generally, when a new volatile compound is formed on the sidewall of the Pt layer to improve the etching slope, the etch rate increases corresponding to the temperature increase. However, as evidenced by this data, the resultant etch rates were similar at each of the various temperatures in this embodiment. Accordingly, the etch rate of the Pt layer sidewall was neither improved nor significantly adversely affected by the chemical reaction generated from the Pt layer at higher temperatures. Also, there is a possibility that Pt does not form volatile compounds under the above process conditions.

According to the present invention, the etching slope of the Pt layer which is used as both plate and storage nodes of the capacitor may be improved. This improvement results from the fact that the erosion degree of the adhesive layer, which is used as an additional etching mask during the Pt layer etching process, changes according to the temperature.

It should be understood that the invention is not limited to the illustrated embodiment and that changes and modifications which can be made will be apparent to those skilled in the art and fall within the spirit and scope of the following claims.

We claim:

1. A method for etching a Pt layer of a semiconductor device, comprising:

forming the Pt layer on a semiconductor substrate where a bottom layer is formed;

forming an adhesive layer of titanium on the Pt layer;

forming a mask layer on the adhesive layer;

patterning the mask layer to form a mask pattern;

patterning the adhesive layer using the mask pattern to form an adhesive layer mask pattern;

heating the semiconductor substrate;

etching the Pt layer with an etching gas containing at least 50% oxygen by flow rate using the mask pattern and the adhesive layer mask pattern, wherein during etching of the Pt layer the adhesive mask pattern is oxidized into $TiO_x$; and removing the mask pattern.

2. The method according to claim 1, wherein a barrier layer is formed on the bottom layer before forming the Pt layer.

3. The method according to claim 2, wherein the barrier layer is formed using titanium nitride (TiN) or a material containing TiN.

4. The method according to claim 1, wherein the semiconductor substrate is heated in a plasma etching apparatus while no plasma is excited.

5. The method according to claim 1, wherein the semiconductor substrate is heated to a temperature of approximately 120~300° C.

6. The method according to claim 1, wherein the etching gas is a mixture of oxygen ($O_2$) and another gas selected from a group consisting of hydrogen bromide (HBr), bromine ($Br_2$), and argon (Ar).

7. The method of claim 1, wherein removing the mask pattern comprises overetching to remove the mask pattern.

8. The method of claim 7, wherein overetching comprises extending an etching time by an additional 0.5~1.5 times the etching time required to etch up to an etching end point of the Pt layer.

9. The method of claim 2, wherein the barrier layer is patterned after removing the mask pattern.

10. The method of claim 1, wherein the etching gas is about 80 percent $O_2$ by flow rate.

* * * * *